United States Patent [19]
Hesselbom et al.

[11] Patent Number: 6,091,027
[45] Date of Patent: Jul. 18, 2000

[54] VIA STRUCTURE

[75] Inventors: Hjalmar Hesselbom, Huddinge; Peter Bodö, Linköping, both of Sweden

[73] Assignee: Telefonaktiebolaget LM Ericsson, Stockholm, Sweden

[21] Appl. No.: 08/994,937

[22] Filed: Dec. 19, 1997

[30] Foreign Application Priority Data

Dec. 19, 1996 [SE] Sweden .................................. 9604688

[51] Int. Cl.[7] ...................................................... H05K 1/03
[52] U.S. Cl. ........................ 174/255; 174/264; 174/262; 361/777
[58] Field of Search ..................................... 174/262, 264, 174/263, 266, 255, 36; 361/794, 792, 777, 780

[56] References Cited

U.S. PATENT DOCUMENTS

| | | |
|---|---|---|
| 4,613,891 | 9/1986 | Ng et al. . |
| 5,253,146 | 10/1993 | Halttunen et al. . |
| 5,266,912 | 11/1993 | Kledzik . |
| 5,315,072 | 5/1994 | Arai et al. ............................... 174/262 |
| 5,322,816 | 6/1994 | Pinter . |
| 5,338,970 | 8/1994 | Boyle et al. . |

FOREIGN PATENT DOCUMENTS 2 150 749  12/1983  United Kingdom .

*Primary Examiner*—Dean A. Reichard
*Assistant Examiner*—Hung V Ngo
*Attorney, Agent, or Firm*—Burns, Doane, Swecker & Mathis, L.L.P.

[57] ABSTRACT

A via structure is obtained by etching a through-hole in a substrate on the via location and placing transmission lines on declining or sloping sidewalls of the hole. The lines continue to conductors on the other surface of the substrate through vias located in a free portion of a thin film structure at the bottom side of the substrate. The free portion is so strong and large, that several vias can be made therein for connection to a plurality of parallel lines forming e.g. a bus structure. The large free portion can be additionally supported by a thick support layer applied on top of the layers in the hole. By applying an isolated ground plane and a dielectric layer between the substrate and the transmission lines, the transmission lines on the sloping sidewalls of the via hole structure can be made impedance matched. The sloping sidewalls of the via hole can easily be obtained using a V-groove etch for a monocrystalline Si-substrate. The via structure obtained is especially well suited for data transmission buses, which do not need to reduce their transmission line density through the via structure.

13 Claims, 5 Drawing Sheets

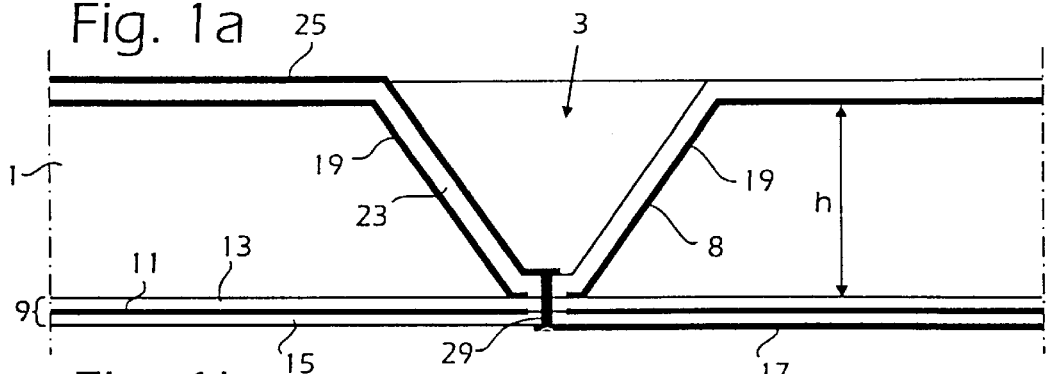
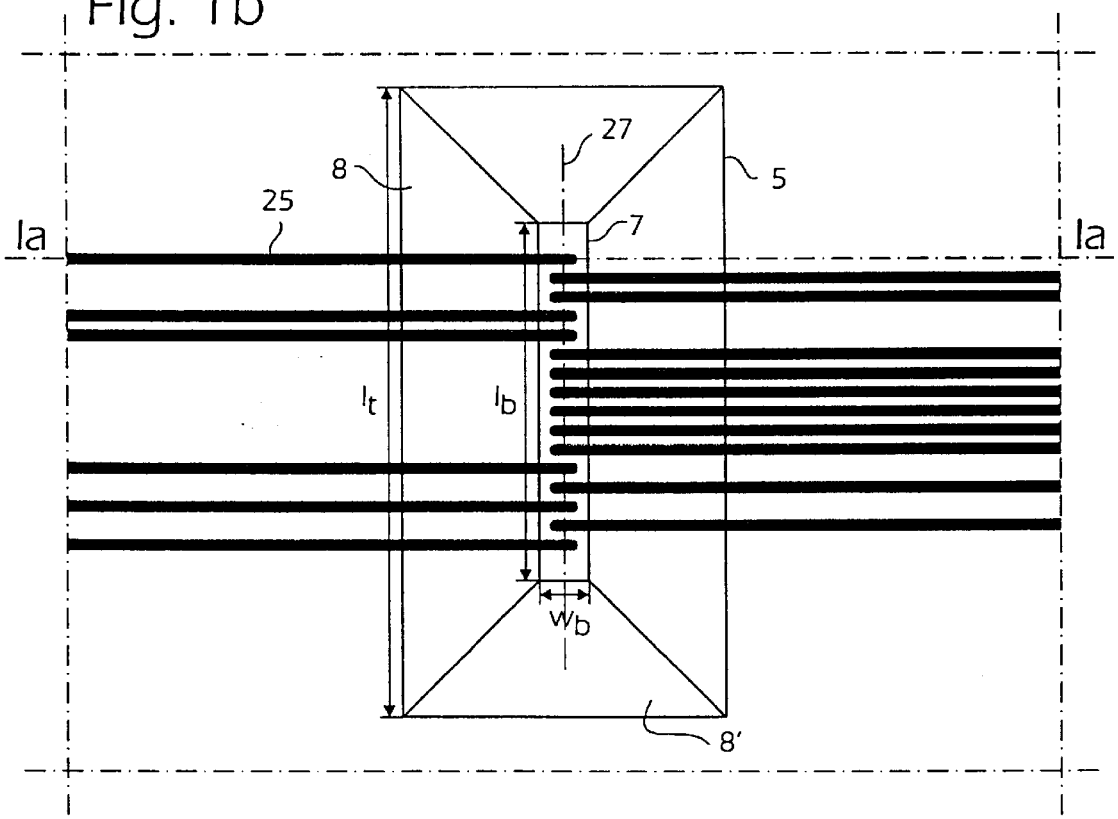
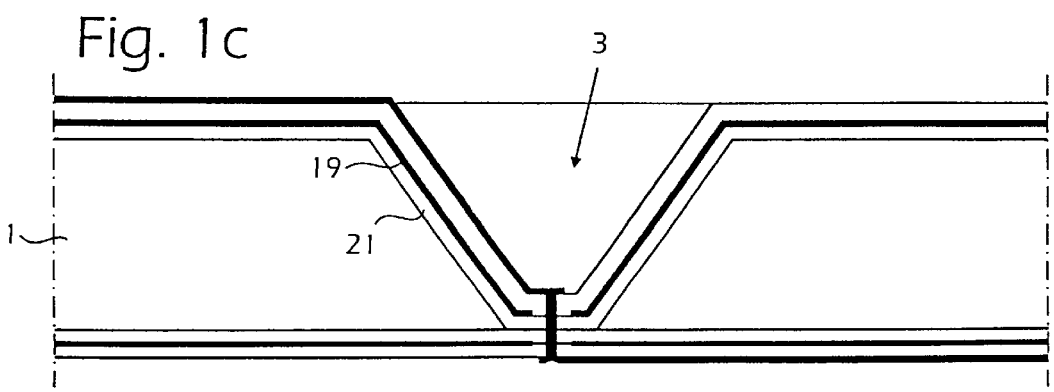

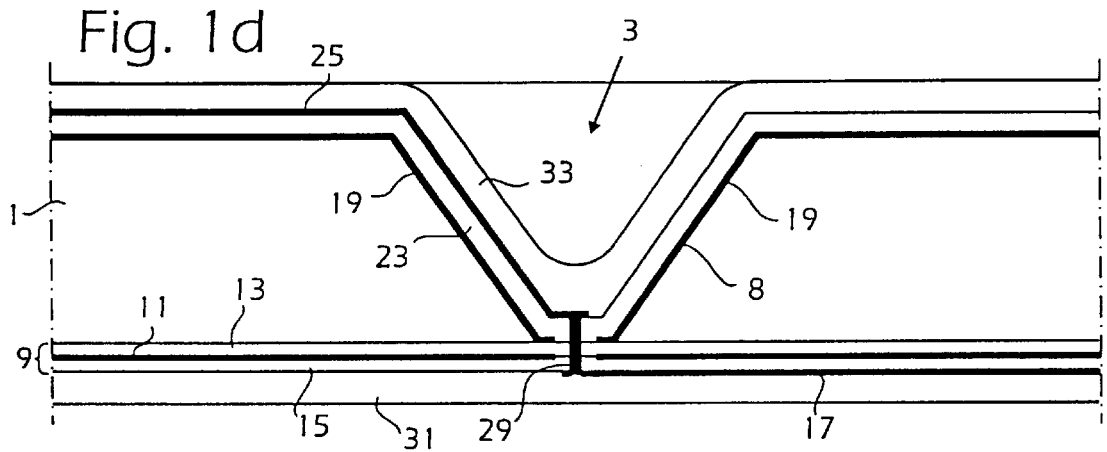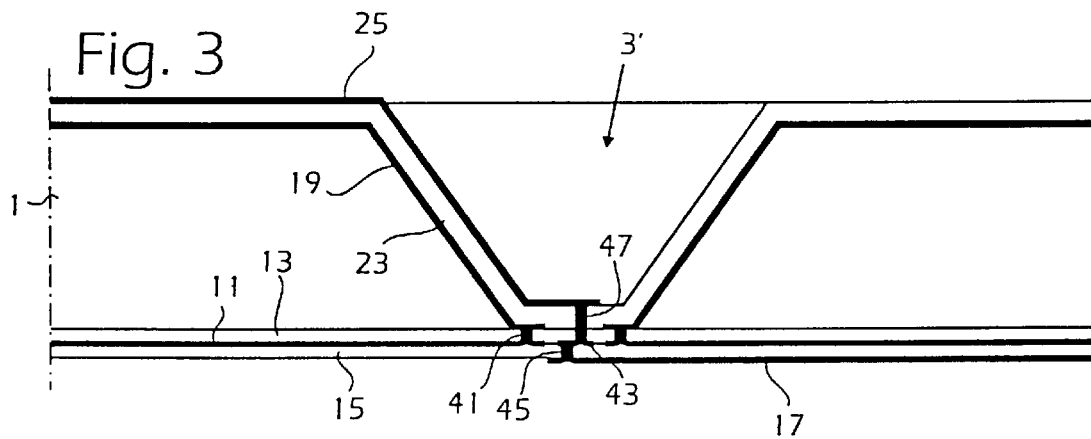

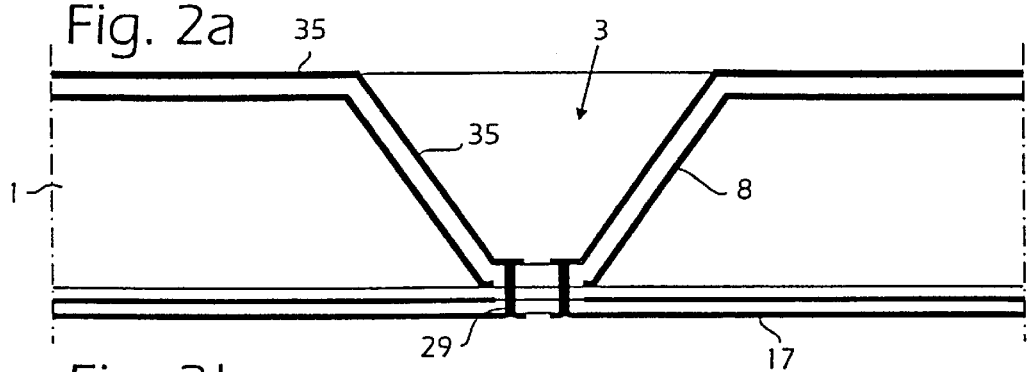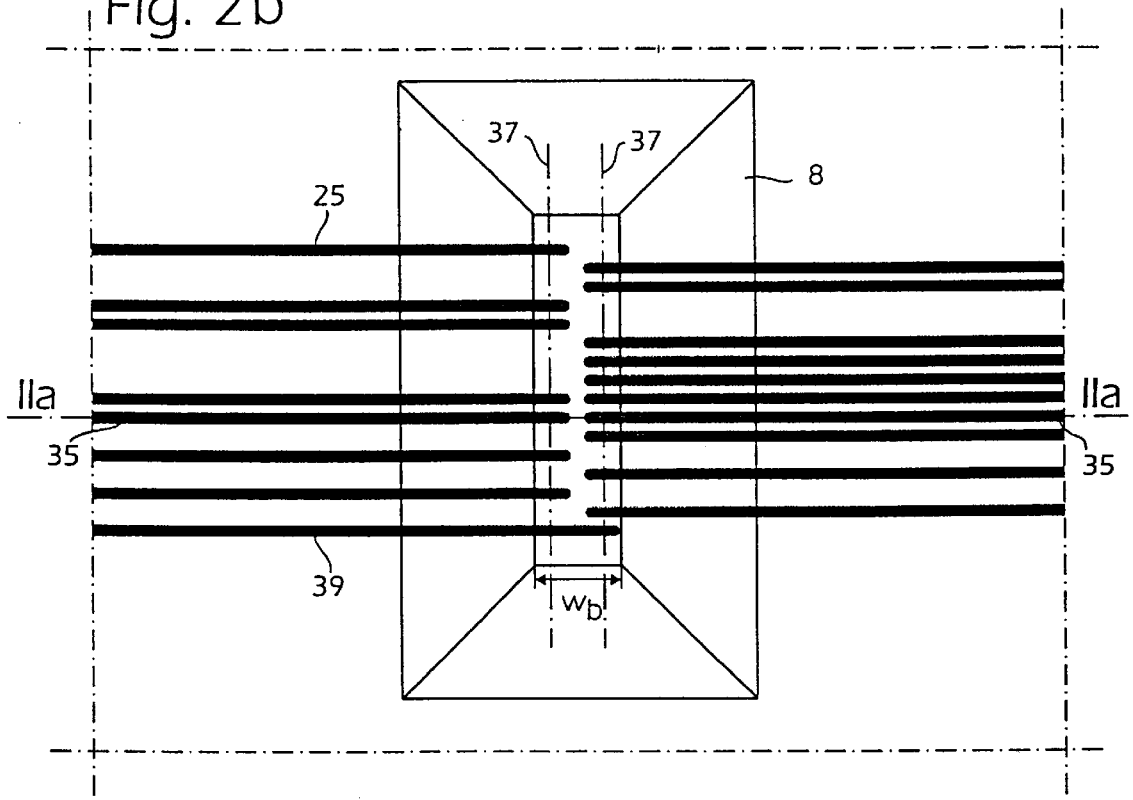

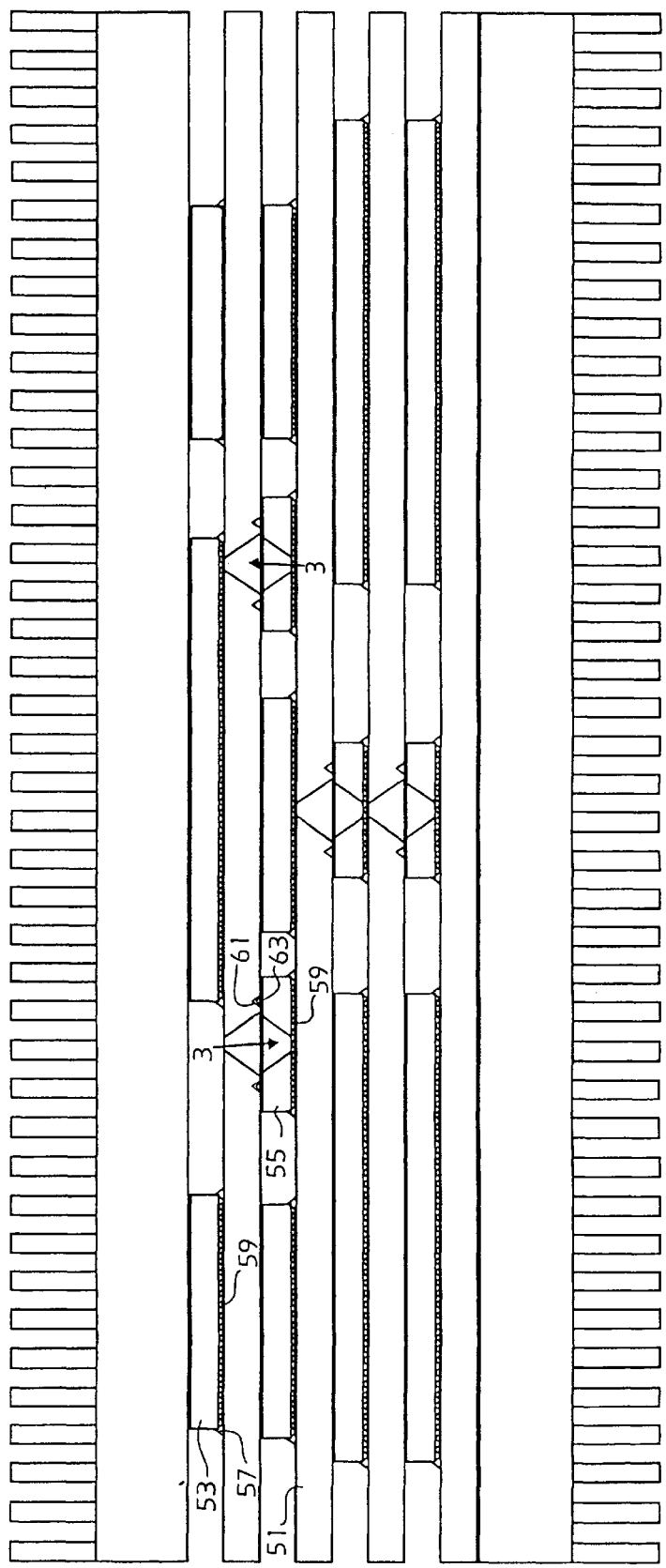

VIA STRUCTURE

The present invention relates to a via structure for a dielectric material, i.e. to a device for electrically interconnecting electrical conductor paths in different planes and to a method of manufacturing such a via structure.

BACKGROUND AND STATE OF THE ART

When designing a via structure for a dielectric material, a via thus being an electrical connection structure for connection of conductors in different planes located adjacent to and in parallel to each other, as used in multilayer circuit boards or other multilayer substrates, several problems may be present. For thick substrates, the vias used for parallel transmission lines in a data bus cannot be placed with the same spacing as the transmission lines owing the aspect ratio of the via holes required in order to obtain a sufficient filling of the via holes with an electrically conductive material. A solution to this problem may be to make the substrate thinner where the vias are to be made.

Thus, in U.S. Pat. No. 5,322,816 a deep feed-through is disclosed using a via arranged at the bottom of a hole having inclining sidewalls. The hole is made by anisotropic etching of a Si-substrate and the walls thereof are covered with a metal material connecting through the via to a metal layer on the other side of the substrate. However, also this hole may have an upper diameter too large for being connected to densely located parallel transmission lines. A similar structure is disclosed in the published British patent application 2 150 749 A.

As disclosed in U.S. Pat. No. 4,613,891 an integrated circuit chip is with its active, upper side attached to the bottom side of a silicon wafer. A hole having sloping walls is etched in the wafer down to the chip. An electrically conducting path extends on the sloping walls and up and on to the top side of the wafer to connect conductive pads on the chip to other components. This structure is not suited for a via structure to be used in a multi-chip multi-level chip module comprising substrates and chips which are dismountable from each other.

Further, when the frequency of a signal, which is transmitted through a via increases, i.e. for high-frequency signals, there may be difficulties of having the signal transmitted without being too much distorted/attenuated or interfering with other signals. These difficulties are in turn associated with portions of the via which are not properly impedance matched.

In general, in order not to impose any too significant error to a transmitted high-frequency signal, the portion of a transmission line, which is not impedance matched, should not exceed 1/20 of the wavelength of the highest frequency of the signal transmitted through the dielectric medium. For example, for a frequency of 10 GHz and an effective relative dielectric constant equal to 3, 1/20 of the wavelength becomes equal to ½ mm, i.e. 500 $\mu$m.

Thus, in the case where an electrical connection path from one component to another involves several vias, such as in a multilayer structure, where an electrical conducting path can pass through several substrates, i.e. through several planes containing electrical conductor paths, the total length of the not impedance matched portions of the connecting path can impose an error to a signal transmitted on this connecting path. In order that repeated not impedance matched portions of the connecting path will not influence the received signal noticeably, it is usually required:

that each not impedance matched portion of the connecting path has a length which is less than 1/20 of the wavelength of the signal, and that the not impedance matched portions are each separated by impedance matched portions each having a length larger than ½ of the wavelength of the signal, i.e. in the case described above by distances of at least 5 mm, which in particular for a connecting path containing repeated vias can not usually be guaranteed.

Another problem resides in that the dielectric medium supporting an electrically conductive path can act attenuating for signals having high frequencies.

A common solution to these problems is to use impedance matched vias designed as coaxial structures. Thus for instance U.S. Pat. No. 5,266,912 describes a multi-chip module, MCM, having external connections on coaxial pins.

A coaxial shielding is disclosed in U.S. Pat. No. 5,253,146 where an earthed intermediate electrically conducting shielding frame is fitted between two circuit boards. The frame has through-apertures enclosing coaxially electrical connectors connecting the circuit boards.

Another method of achieving impedance matching is disclosed in U.S. Pat. No. 5,338,970 describing a multilayered package using a shielding technique to improve high frequency performance of the package. This is obtained by using shield vias placed near conductive vias to create a two-wire transmission line having a controllable characteristic impedance.

However, it is for example very difficult to create coaxial via structures which are much longer or deeper than they are wide, i.e. have an aspect ratio much larger than 1. For instance, a typical distance between two parallel electrical conductors on the same side of a multi-chip module or MCM is 50–75 $\mu$m, whereas the thickness of the substrate is between ½ and 1 mm. In order not to fan out the transmission lines at a via used for a signal bus comprising several parallel electrical conductor paths, coaxial structures having an outer diameter of approximately 20 $\mu$m and a length of 0.5 mm would be required, i.e. structures having a ratio of their lengths to their thicknesses of 25:1, which can be a very difficult to achieve practically.

For example, assume that a coaxial structure having an outer dimension, i.e. the diameter of the outside of the shielding metal, of 25 $\mu$m and a characteristic impedance of 50 ohms is required. Also assume that the thickness of the shielding metal is 3 $\mu$m. This results in an outer diameter of the insulator of 19 $\mu$m. Further assume that the relative dielectric constant of the insulator is equal to 3, which according to the equation $$Z_0 = 59.97 \cdot \mathrm{sqrt}(1/\varepsilon_r) \cdot \ln(R/r)$$

where $\varepsilon_r$ is the relative dielectric constant of the insulator, R and r are outer and inner diameters of the insulator respectively, results in that the diameter of the inner conductor is 4.5 $\mu$m for 50 Ohm. In order to cover the walls of the 25 $\mu$m hole approximately uniformly with the shielding metal, some form of vapour phase or liquid phase deposition is required for a length or depth-to-diameter ratio of approximately 26 in this case, since evaporation or similar methods do not provide a satisfying uniformity of the layer produced. For metals having a high conductivity, a first deposition can be obtained from a non-electric plating, which can provide a very uniform but probably thinner layer.

This layer can by thickened by means of electrolytic plating, but it will be difficult to preserve a uniform thickness due to transport and current limitations. Fairly uniform layers can be obtained from tungsten W directly from a vapour phase. However, the metal W has a relatively high electrical resistivity and may be unsuitable as a shielding material.

However, it should be possible to deposit relatively uniformly, directly from a vapour phase, an insulator of the polymer material "Pyraline", and since, when depositing this material, the deposition will occur mono-layer by mono-layer, it should be possible to obtain uniform depositions also at length/diameter ratios of about 20, such as in this case.

The most difficult problem is associated with producing the inner, central conductor.

A diameter of 4.5 µm results in a length/diameter ratio of 111 according to the discussion above, which in turn results in that probably every kind of deposition method used for producing such a very thin plug will be suffering from some form of transport limitation resulting in a large risk for the ends of the through-hole to be closed before a sufficiently thick metal layer has been deposited on the interior portions of the walls of the hole.

SUMMARY

It is an object of the present invention to provide a via structure that overcomes the problems of forming a via structure for a bus of transmission lines or other densely packed conductors, in particular the problems associated with coaxial via structures.

In particular it is an object of the invention to provide a via structure which comprises electrical conductors that can be made impedance matched over almost their entire length, the small portions which are not impedance matched not disturbing high frequency signals transmitted through the via conductors.

It is another object of the invention to provide a via structure requiring a little place or little area on a substrate.

It is another object of the invention to provide a via structure allowing densely spaced parallel conductor paths to be coupled to similar conductor paths on an opposite surface of a substrate, the via structure forming continuations of the conductor paths, the continuations extending substantially straightly forwards from the conductors or so that they are located in substantially the same plane perpendicular to a substrate surface where the conductors are located.

It is another object of the invention to provide a via structure having via conductors connecting densely spaced parallel conductor paths to similar conductor paths on an opposite surface of a substrate, the via conductors having the same spacing as the densely spaced conductors, as seen in the same direction as for the conductors.

Further, it is an object of the invention to provide a method of manufacturing via structures allowing the via conductors to be impedance matched over almost their entire lengths and the via conductors to be located with the same dense spacing as regular electrical conductors in a bus structure.

A via structure does not have to use a coaxial structure for achieving a substantially impedance matched via. Instead, the via is formed by etching a substrate from the top surface thereof in order to obtain a through-hole having sloping sidewalls that thus decline from the top surface. A transmission line or a bus of transmission lines then continues from one surface of the substrate to the opposite surface along the sloping sidewalls of the etched hole, by means of a patterned conductor or patterned conductors located thereon. The portions of the electrical conductors of the via structure present on these sloping sidewalls are made impedance matched by means of a layer of a suitable dielectric layer located directly under the conductors forming the transmission lines and by means of a ground plane located between the dielectric layer and the substrate. At the bottom of the through-hole there are provided short, not impedance matched electrical conductors coupling the transmission lines on a sloping sidewall to transmission lines at the bottom surface of the substrate.

The bottom of the through-hole can be closed by a thin-film structure extending over the bottom surface of the substrate and comprising the transmission lines of the substrate bottom surface. Then the short, not impedance matched portions of the via conductors will have a length substantially corresponding the total thickness of layers required for making these bottom surface transmission lines impedance matched, i.e. for example corresponding to the sum of the thickness of a ground plane or ground layer and of a dielectric layer. The thickness of the layers of a thin film is of the magnitude of 2–10 µm and therefore signals having very high frequencies can travel through the not impedance matched portions of the via conductors without being noticeably affected.

Generally worded thus, a via structure has electrical conductor paths or transmission lines on each of two opposite surfaces, a front or top conductor path on a front or top surface forming a top transmission line and a rear or bottom conductor path on a rear or bottom surface forming a bottom transmission line, the via structure being made in a substrate which generally is electrically isolating or at least electrically semiisolating and in the normal case has the shape of a thin, substantially flat plate. The substrate can e.g. be a via chip used in a three-dimensional multi-chip module for electrically interconnecting different levels of or different stacked substrates of the module or be one of the substrates in a three-dimensional multi-chip module, which have electrical conductors in several parallel planes and in particular at top and bottom surfaces and which carry electronic components interconnected by the conductors. In particular the substrate can be made of undoped monocrystalline silicon and for example be a silicon chip of the type used in manufacturing integrated circuits.

A through-hole in the substrate is made to have sidewalls declining from a top opening at the front surface down to a bottom opening at the rear surface of the substrate. The sidewalls can have e.g. an angle of 45–60° in relation to the surfaces of the substrate. In the case of a monocrystalline Si-substrate the hole can made by anisotropic etching so that the sidewalls will have an angle of 54.74° in relation to the surfaces of the substrate. An electrically isolating and/or dielectric film covers the rear or bottom surface to which the through-hole declines, so that the rear conductor path is located on the under surface or bottom surface of the film. A first aperture is provided in the film at the end of the rear conductor path extending from the bottom surface of the film and terminating at a location inside the bottom opening of the through-hole. This location can preferably such that there is a substantial distance of the aperture to a neighbouring lower edge of a sidewall of the hole, this distance for example corresponding to at least the diameter of the aperture. An electrical conductor path starts at the top conductor path and extends along a sidewall downwards into the bottom opening up to the first aperture. This electrical conductor will then preferably pass a substantial distance on the upper surface of the free portion of the film from the sidewall up to the first aperture or recess, this distance then corresponding e.g. at least to the diameter of the aperture. Electrically conducting material in the aperture forms a via which electrically interconnects the sidewall conductor path and the rear conductor path.

In order to achieve a dense spacing of transmission lines and a small area for through-connections a plurality of vias or at least two distinct vias are arranged at the bottom of the through-hole. This means that the cross-section area of an individual via must be a small portion of the area of the bottom surface of the through-hole, e.g. less than a tenths thereof. A corresponding number of transmission lines or sidewall conductor paths on the sidewalls can then be connected to the vias, each transmission line for example to an individual via. Thus generally, at least two sidewall conductor paths connected to a respective via can be arranged. Two such sidewall conductor paths can extend in parallel and adjacent to each other in order to end at connected vias which then can be located along a line substantially perpendicular to the conductor paths. Two such sidewall conductor paths can also extend along lines located in a plane perpendicular to the surfaces of the substrate and they can then end at and be connected to vias also located in this plane. For supporting and protecting the free portion of the electrically isolating film in the bottom opening a support layer can be arranged on top of the upper surface of the film, inside the through-hole, and extending on to the sidewalls.

The sidewall conductor path, can be made impedance matched to form a high-frequency transmission line by applying suitable layers of material to the sidewall, where the sidewall conductor path is located. Thus a first layer of dielectric material is located on the sidewalls and under the sidewall conductor path. A first electrically conductive layer is located directly underneath the first layer of dielectric material and is intended to be connected to electric signal ground, when the structure is used. The dielectric material and the thickness of the first layer can then be selected for making the sidewall conductor path impedance matched.

Also the rear conductor path can be made impedance matched by arranging a second electrically conductive layer located between the dielectric film and the bottom surface of the substrate and intended to be connected to electrical signal ground. Then a second layer of dielectric material is placed between the second electrically conductive layer and the bottom surface of the substrate. For interconnecting the two ground layers a second aperture is made in the second layer of dielectric material so that it terminates inside the through-hole. An electrically conducting material in this aperture forms a via electrically connecting the first and second electrically conductive layers to each other.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

A complete understanding of the invention and of the above and other features thereof may be gained from a consideration of the following detailed description of non-limiting embodiments presented hereinbelow with reference to the accompanying drawings, in which:

FIG. 1a is a cross-sectional view of a via structure;

FIG. 1b is a view from above of the via structure shown in FIG. 1a, the view of FIG. 1a being taken along the line Ia—Ia of FIG. 1b;

FIG. 1c is a cross-sectional view of a via structure according to FIG. 1a having an additional layer for electrically isolating a ground layer;

FIG. 1d is a cross-sectional view of a via structure according to FIG. 1a having additional exterior protective polymer layers;

FIG. 2a is a cross-sectional view of an alternative embodiment of a via structure allowing densely located transmission lines;

FIG. 2b is a view from above of the via structure shown in FIG. 2a, the view of FIG. 2a being taken along the line IIa—IIa of FIG. 2b;

FIG. 3 is a cross-sectional view of a via structure substantially made as that of FIG. 1a but having interconnections of ground planes located at top and bottom surfaces;

FIG. 5 is a cross-sectional view of a multi-chip packaging arrangement in which the vias of FIGS. 1a–4 can advantageously be used.

DETAILED DESCRIPTION

Figure 4:
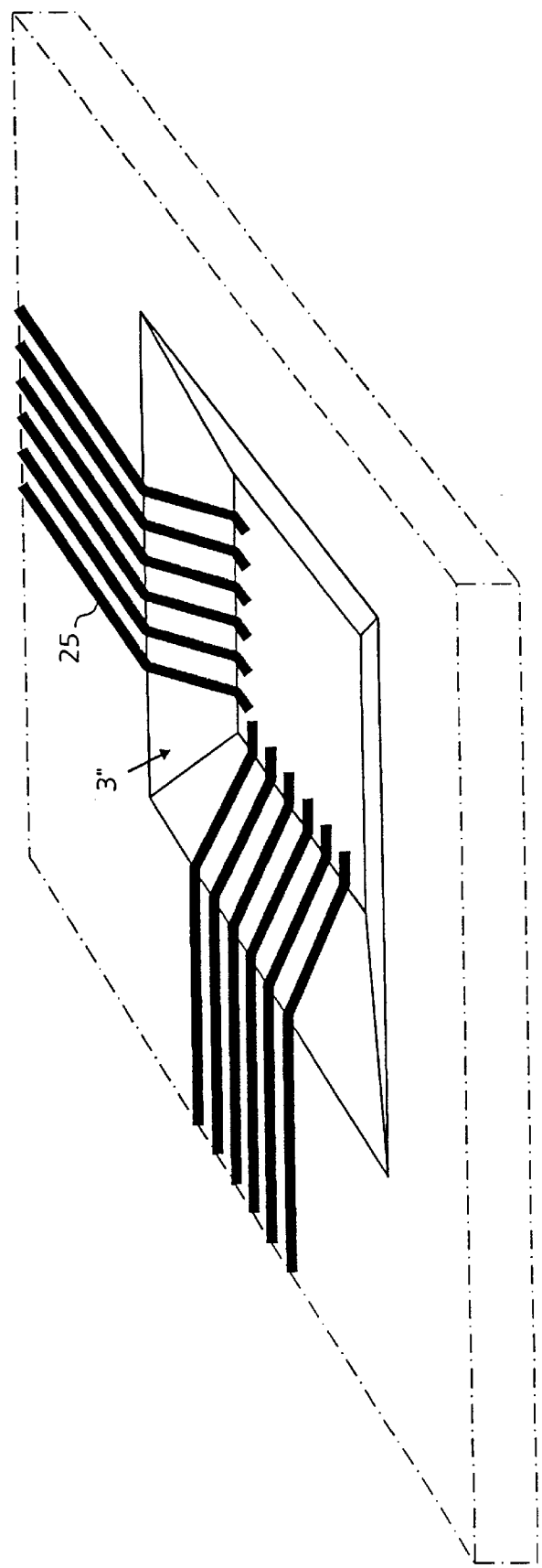
FIG. 4 is a schematic perspective view of a via structure as seen obliquely from above allowing transmission lines in four perpendicular directions.

In FIG. 1a, a cross section of a via structure is shown. The figure shows a portion of a monocrystalline Si-substrate 1, which has been etched through from the top surface to the bottom surface thereof by means of V-groove etching or anisotropic etching to form a groove 3. The groove 3 has a tapering configuration and it thus wider and broader at the substrate top surface that at the substrate bottom surface. For a suitable orientation of the V-groove 3 in relation to the crystalline directions of the substrate 1 it will have a rectangular shape as seen from above or perpendicularly to the plane or surface of the substrate 1, as is better visible in the plan view of FIG. 1b. At the top surface of the substrate 1 thus a large rectangular opening 5 is formed and at the bottom surface a smaller rectangular opening 7 is formed, concentric to the upper one and similar thereto. The four flat sloping sidewalls 8, 8' of the V-groove etched through-hole 3 have an angle of inclination of 54.74° for Si-substrates 1 having a <100> surface orientation, as will be discussed hereinafter.

At the bottom surface of the substrate 1 a thin film structure 9 is located comprising an electrically conducting, ground plane 11 sandwiched between two layers of a dielectric or electrically insulating material, an inner, rear or upper layer 13 and an exterior or front, lower or bottom layer 15. The thin film structure 9 extends in a substantially flat and unbroken manner under the hole 3, thus bridging the bottom opening 7 of the hole. Electrical transmission lines 17 are located on the free surface of the undermost dielectric layer 15 of the thin film structure 9.

At least on the long sidewalls 8 of the through-hole 3, which are located opposite each other, but preferably also on the short opposite sidewalls 8', and on the top surface of the etched substrate 1, an electrically conducting layer 19 has been deposited, which serves as a ground plane and can extend onto the bottom surface of the V-groove 3, on the upper or rear, inner surface of the thin film structure 9, on the free upper surface of the inner dielectric layer 13 thereof. The electrically conducting layer 19 is to be connected to signal ground when using the via structure. The electrically conducting layer 19 can be electrically isolated from the substrate 1 by means of an electrically isolating layer 21, see the cross-sectional view of FIG. 1c, which is located directly on top of the substrate surface and directly below the conducting ground layer 19 and thus extends all over the sloping sides of the V-groove 3 and over the bottom surface thereof constituted by the rear side or upper surface of the thin-film structure 9.

On top of the electrically conducting ground layer 19, a layer 23 of a dielectric material is located extending all over the top surface of the substrate 1, over the sloping sidewalls of the groove 3 and over the bottom surface thereof. Transmission lines or generally electrical conductor paths 25 extend on top of the dielectric layer 23. They may for instance, as is illustrated in FIG. 1b, all be parallel to each other with a suitable spacing in the vicinity and inside the groove 3 and extend generally perpendicularly to the longitudinal direction of the hole 3 and its long sidewalls 8. Such a conductor path 25 will thus extend from the substrate top surface down along a long declining sidewall 8 on to the bottom surface of the groove 3 to terminate there, to end a little past or beyond the longitudinal center line 27 of the bottom opening of the groove 3. It can also continue up along the opposite sidewall 8 to the substrate top surface located on this side of the well 3 but this case is not shown in the figure. The center line 27 extends in the longitudinal direction of the groove 3, in the plane of its bottom opening 7 and in parallel to its long sidewalls 8.

In the lower opening 7 of the hole 3 the transmission lines 25 are thus carried by the thin film structure 9 and the electrically isolating layer 23. There they are through vias 29 electrically connected to the transmission lines 17 at the bottom surface of the structure. The vias 29 are vertical or perpendicular, electrically conducting lines such as plugs or tubular structures formed by depositing electrically conductive material over and into through-holes made in dielectric, electrically isolating layers. The vias 29 thus pass through the thin film structure 9 and the electrically isolating layer 23 at the areas thereof located at the bottom 7 of the groove 3. In the via structure of FIG. 1c the vias 29 will then extend also through the additional, electrically isolating layer 21. The vias 29 can for example be located along the center line 27, see FIG. 1b. The upper ground layer 19 and the ground layer 11 of the thin film structure 9 do not extend into the area of the vias 29, i.e. not close thereto, but have appropriately and correspondingly designed apertures there so that there is no risk that they will electrically contact the vias 29. Such an aperture can have the same shape as the lower opening 7 of the groove 3 or have a shape similar to this opening and be located concentrically and in parallel therewith and thus with the groove 3.

FIG. 1b illustrates the dense packing of the transmission lines 25 on the substrate top surface and on the long sidewalls 8 of the groove 3 and the generally straight configuration of the lines 25 not requiring any "fan-out" of the lines in the vicinity of or at the sidewalls of the hole 3, this fact making the via structure very compact and making it require little space or area on the substrate 1.

In order for the transmission lines 25 at the substrate top surface and in the groove 3 to have their impedance matched in a suitable way to allow high frequency signals to pass therealong in a basically shielded and unattenuated way, it is required that the thickness of the dielectric layer 23 located directly underneath the transmission lines 25, on top of the ground layer 19, is selected accordingly and is approximately constant for the entire lengths of the transmission lines 25. This means that in particular the thickness of the portions of this dielectric layer 23 located on the long sloping sidewalls 8 is at most allowed to at most deviate in a limited and reproducible fashion in relation to the thickness of the portions of the same dielectric layer 23 which are located on the upper, top horizontal surface of the substrate 1, around the top opening 5 of the hole 3.

The topmost and undermost layers of the structures of FIGS. 1a–1c can be protected by additional polymer layers, see the cross-sectional view of FIG. 1d. One protective polymer layer 31 then covers all of the bottom, free surface of the thin film structure 9 and the bottom transmission lines 17. Another protective polymer layer 33 covers all of the upper free surface of the dielectric layer 23 and the transmission lines 25. Also, there can be provided outermost shielding or ground planes, not illustrated in the figures. In that case there will be dielectric layers similar to those indicated at 15 and 23 but located directly on top of or at the bottom surface of the electrical conductors of the transmission lines and then these dielectric layers are covered by ground layers similar to those shown at 19 and 11 respectively. The protective layers 31, 33 will in any case be the outermost layers.

The substrate groove of the via structure can be made wider than what is illustrated in FIGS. 1a–1d. Thus the width $w_b$ of the bottom opening 7 is increased in the embodiment of FIGS. 2a and 2b. This will make it possible to arrange parallel signal conductors or transmission lines 25 on two opposite declining sidewalls 8 of the via structure 3 with the same density or spacing as if only one sidewall at a time would have been available. This is illustrated in the plan view of FIG. 2b, which shows both opposite double signal conductors 35 and single signal conductors 25 like those in FIGS. 1a–1d. Then the vias 29 in this case will be e.g. located along two parallel lines 37 extending in the longitudinal direction of the groove 3 in the bottom opening 7 thereof. Thus two opposite conductors 35 will end at vias 29, one of which is located in one parallel line 37, and the other one is located in the other parallel line, these two vias 29 then being also located in the direction of the two considered transmission lines 35, on a line perpendicular to the two parallel lines 37. The single conductors 25 can in this embodiment terminate in vias 29 located in either line 37, see the conductor 39 in FIG. 2b.

Vias can also be arranged for electrically interconnecting the upper and lower ground planes 103 and 109, as will now be described with reference to FIG. 3. Here the groove 3 is made with a width $w_b$ exceeding that illustrated in FIG. 1a, e.g. like the embodiment of FIG. 2a. The lower ground layer 11 and the upper ground layer 19 extend here also into the area of the bottom opening 7 of the groove 3, substantially identical apertures being formed there in these layers which are located in parallel and concentrically with each other. Short vias 41 are located in two parallel longitudinal lines at the bottom of the groove 3 and electrically connect the ground layers with each other, these vias 41 extending basically only through the inner dielectric layer 13 of the thin film structure.

In the lower ground layer 11 there are also islands 43 inside the aperture of this layer, the shape of the islands e.g. being substantially rectangular. The islands 43 are located well inside the aperture, so that they are electrically isolated from the borders of the aperture and thus from the rest of this layer 11. They are also located at suitable distances from each other so that they are electrically isolated from each other. The electrically conducting islands 43 are electrically connected through lower short vias 45 to corresponding transmission conductors 17 on the bottom side of the structure, the short vias 45 passing only through the exterior isolating layer 15 of the thin film structure 9. The islands 43 are also electrically connected through upper long vias 47 to the transmission lines 25 on the top side of the structure, which extend on to the bottom of the groove 3. The upper vias 47 thus extend through the upper, inner isolating layer 13 of the thin film structure 9 and through the dielectric layer 23 located at the top surface of the substrate. The electrical connecting function of a via 29 of the structure of FIG. 1*a* is here thus performed by two vias 45 and 47 connected by an island 43.

If the width $w_b$ of the bottom opening 7 of the groove is sufficient, electrical conductors for transmission lines can be also provided at the declining, short end surfaces 8' of the groove 3. The width $w_b$ can even be so much increased that the bottom and top openings 7, 5 of the groove are shaped as rectangles having a ratio of the length of adjacent sides being closer to 1:1, so that the hole 102 cannot easily be called a "groove", the embodiments of FIGS. 1*a*–2*b* illustrating a ratio of about 4:1. An embodiment of a substantially square "groove" 3 is shown in the perspective view of FIG. 4. Transmission lines 25 are here shown to be located at two adjacent declining sidewalls.

The structure as described above can be located in a chip or silicon wafer and then the chip can serve as a via chip interconnecting the top surface of a lower substrate and the bottom surface of a substrate placed on top of the via chip. Such an arrangement is for example very useful in a three-dimensional multi-chip module MCM, when interconnecting different layers in the MCM, see the Swedish patent application No. 9604690-9, "A packaging structure for integrated circuits".

Thus, in FIG. 5 a cross-section of a three-dimensional multi-chip module is shown having four substrates 51 carrying integrated circuit chips 53 and via chips 55 on their top surfaces. Positioning bumps 57 on the top surfaces of the substrates 1 cooperate with edges or corners of the integrated circuit chips 53 and via chips 55. Electrically connecting bumps for connecting the surface layers of the substrates 1 to electrically conducting areas on the bottom surfaces of the various chips 53, 55 are shown at 59. Furthermore FIG. 5 shows the alignment of a via chip 55 with a substrate 51 located on top of the via chip 55. The alignment is for example obtained in the way disclosed in the Swedish patent application No. 9604678-4, "Bumps in grooves for elastic positioning". If such an alignment is used, V-grooves 61 are etched in the respective substrate, i.e. in its top and/or in its bottom surface, for receiving elastic bumps 63 located at the top surface of the via chips 9. The cooperating bumps 63 and the V-grooves 61 can be designed to also electrically connect the via chips 55 and the next-above located substrate 1 to each other by means of the device disclosed in the Swedish patent application No. 9604677-6, "High density electrical connectors".

The via chips 55 of FIG. 5 have via structures as described above comprising deep V-grooves 3 having electrical conductors on their oblique surfaces. Such via structures are also arranged in the substrates 51 but upside down. The deep V-groove 3 of a via chip 55 connecting to a substrate 51 located on top thereof are in the illustrated embodiment placed along the same vertical line as the deep V-groove of the via structure in the substrate, the cooperating alignment bumps 63 and low V-grooves 61 being located symmetrically on both sides of the deep V-grooves 3 of the via structures.

The fabrication of a via structure as described above will now be described. The fabrication process will cover all steps necessary for making a via structure of the type illustrated in FIG. 3 having interconnected ground planes 11, 19 and in addition having an isolating layer 21 directly under the upper ground layer 19, see FIG. 1*c* and protective polymer coatings 31, 33, see FIG. 1*d*. It is also applicable to fabricating the structure of FIGS. 2*a*–2*b*. The fabrication starts from a monocrystalline Si-wafer or Si-substrate 1. The wafer 1 is first coated with silicon nitride on both surfaces—the silicon nitride layers are thin and are not visible in the figures. One surface, the bottom surface, is also covered with a dielectric layer 13 of polymer of e.g. type benzocyclobutene BCB by spinning/rotating and curing. The silicon nitride on the opposite surface, the top surface, is etched using a photo-resist mask, to produce windows which define the sizes of the top openings 5 of the grooves 3. The sides or edges of the mask windows are supposed to be well aligned with suitable crystal directions to allow the following etching step to be performed in the intended way. The wafer is then etched using an anisotropic etchant, e.g. KOH at about 85° C., to produce the grooves 3.

For Si-wafers having a <100> surface orientation the inclined walls 8, 8' of the grooves 3 produced by the anisotropic etching have the angle of 54.74° in relation to the surface of the wafer, in the case where the sides of the openings are well aligned with preferred crystal directions. Assuming such a groove or hole 3 to be an inverted truncated pyramid having a length $l_b$ of its smaller, lower surface equal to 50 μm and a depth h of 500 μm, that is equal to the thickness of the substrate 1, the length $l_t$ at the top surface of the hole 3 will be $$l_t = l_b + 2h/\tan 54.74°$$

which in this case is equal to 687 μm.

Depending on the polymer used for the inner layer 13 on the bottom surface, the free bottom surface of the structure may need to be protected from the etchant for example by using some suitable mask material. If the sides of the apertures in the mask have approximately the same lengths, silicon will be removed so that a truncated pyramid is formed according to FIG. 4. In any case the etched hole or groove 3 is terminated at the silicon nitride and polymer film 13 at the opposite or bottom surface of the wafer, the silicon nitride and polymer film 13 bridging the lower opening 7 of the etched hole or groove 3.

Depending on whether the upper ground plane 19 is to be directly in contact with the Si-substrate 1 or not, the next step will be to metallize the surface of the wafer which has been etched or prior to this deposit a dielectric or electrically insulating material 21, see FIG. 1*c*. This layer could be a silicon oxide layer, but in the case where a low dielectric constant is wanted the dielectric used would be a suitable polymer.

In order for such a dielectric layer 21 to be deposited sufficiently conformally over the walls and bottom of the hole, some sublimation or precipitation method from a gaseous phase or from a liquid can be used. A material which will work is the polymer "Pyraline" mentioned above. After a metallization 19 made on top of this dielectric layer 21 and also after the metallization without depositing any such dielectric layer, the obtained ground plane metal layer 19 needs to be patterned at the bottom of the hole 3 to remove electrically conducting material there. Thus, suitable windows are made in the ground plane 19 around the places where the vias 29, 47 are to be made later which must be electrically well isolated from the ground plane 19. For example, all of the ground plane metal located in the middle part at the bottom of the hole can be removed to make a single window having a shape similar to that of the bottom opening 7 of the groove 3.

This is done using direct etching or using lasers but can also be performed using plasma or wet etching, using a photo resist as a mask. In order to obtain a reasonable exposure of that resist as well as ensuring a sufficient coverage of the sidewalls 8, 8' of the holes 3 a well conforming resist will be required. This will have to be deposited by sublimation from a liquid or gaseous phase or by electroplating which can be used since the resist is to be deposited onto a metal layer 19.

After this a new dielectric layer 23 is deposited in a way similar to the above, and following this, the signal conductor metal layer is deposited and patterned for producing the transmission lines 25, 35, 39, using the same methods as above. The typical thicknesses are about 2 to 4 μm for metal layers and around 10 μm for dielectric layers at line-widths of the electrical conductors of the transmission lines of a few tens of micrometers.

In order to increase the strength of the structure supported over the hole 3 at the lower opening 7 thereof and consisting of the original silicon nitride layer and the inner BCB-layer 13 plus the metal and dielectric layers deposited from the top surface, this upper surface having the exposed holes 3 is spun with benzocyclobutene to form the layer 33, see FIG. 1d, which forms rather thick depositions at the middle or bottom of the holes 3. After curing the protective and supporting BCB-layer 33 processing is started at the backside or bottom surface of the wafer 1 in a fashion similar to normal thin film processing for multichip modules. Thus, using a resist mask the vias 29 for signal transmission and also vias 41 for the ground planes 19, 11, if they are to be interconnected, are etched using plasma etching.

Even if the thicknesses of the dielectric layers are different for the upper portions 47 of the signal vias and the ground plane vias 41 in the structure of FIG. 3, the etching can be done in the same step, since the etching composition used for the dielectric has almost no etching rate for metal. After this step via holes have been created which reach up to the upper ground plane 19 and the upper signal metal layer, i.e. up to the transmission lines 25, 35, 39. When metal is deposited after this step to form the lower ground plane 11 and the islands 43, the deposited metal covers the holes and establishes vias in the same way as vias are formed in conventional deposited thin film substrates in multi-chip modules. This is possible because the aspect ratio can be made at around one depending on the thicknesses of the dielectric layers and the diameter of the via hole. This is then in contrast to those aspect ratios which are possible when making a conventional via at the same pitch. In the figures the thicknesses of the various layers are exaggerated in order to make the figures clearer. Generally thus, the holes made for the vias will be much more shallow than what is apparent from the figures.

Then a patterning of the now formed lower ground plane 11 is made in order to isolate the signal vias 29 or to form the via islands 43. A dielectric layer 15 is applied to the lower, free surface of the structure, mainly on the lower surface of the lower ground layer 11. Then again via holes for the vias 29, 45 are etched down through the respective polymer layer or layers up to a metal layer or metal portion, which can be a transmission line 25, 35, 39 for the structure of FIGS. 1a and 2a and a via island 43 for that of FIG. 3. The free underside or bottom surface of the structure is metallized to form the respective vias 29, 45 and patterned to form the transmission lines 17 at the bottom surface. Finally, on the bottom surface a protective polymer layer 31 is spun and cured.

In the embodiments of FIGS. 1a, 1c, 1d, 2a the transmission line vias 29 can possibly be a little long or deep, in particular when there is an isolating layer 21 directly on top of the silicon substrate 1. Etching of holes for those vias will then require long time. The structure of FIG. 3 can then be favourable, also in those cases where the vias for interconnecting the ground planes are not needed or produced. It will only require one additional step, etching the upper via hole portions.

In any case, a suitable etching agent used for etching holes for the vias will not harm the ground plane or transmission line portions exposed inside the holes because the difference of the etching rates which are possible to obtain for dielectric materials and metals can be made very larger The different steps of the fabrication process are summarized below:

1. Coating with silicon nitride on both surfaces
2. Spinning polymer on bottom surface
3. Patterning top surface silicon nitride to produce openings suitable for forming the grooves.
4. Etching grooves down to polymer at bottom surface
5. Oxidizing to form/Depositing isolating layer on top surface—only for the embodiment of FIG. 1c
6. Metallizing top surface
7. Removing metal layer at bottom of grooves
8. Depositing dielectric layer on top surface
9. Depositing metal layer on top surface
10. Patterning metal layer to form conductors
11. Spinning polymer protective layer on top surface—only for the embodiment of FIG. 1d
12. Etching via holes from the bottom surface—only for the embodiment of FIG. 3
13. Depositing metal layer on bottom surface to also fill via holes—the filling only needed for the embodiment of FIG. 3
14. Patterning metal layer on bottom surface to isolate vias for transmission lines or via islands of the island—via islands only needed for the embodiment of FIG. 3
15. Depositing dielectric layer on bottom surface
16. Etching via holes from bottom surface
17. Depositing metal layer on bottom surface to also fill via holes
18. Patterning metal layer on bottom surface
19. Spinning protective polymer layer on bottom surface—only for the embodiment of FIG. 1d Thus, a via structure is obtained which has via conductors that can be made very well impedance matched by making its substantially conventional via plugs very, very short, so that the length of the not impedance matched portions of the via structure is reduced to about the thickness of a thin film structure. The length of the not impedance matched portion of the via can easily become shorter than ¹/₂₀ of the shortest wavelength used. Furthermore, the packing density of transmission lines in the obtained via structure can be as high as in a normal data signal bus applied on top of a substrate. This makes it possible to reduce the space needed for obtaining the via structure, which in turn makes it possible to reduce the size of for instance a multi-chip module MCM having a substrate that requires electrical connections between opposite surfaces or of a three-dimensional multi-chip module requiring electrical connections between adjacent levels of the module.

Additional advantages and modifications will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents.

What is claimed is:

1. A via structure comprising:
an electrically isolating or semiisolating substrate having first and second opposite surfaces, a front surface and a rear surface;
electrical conductor paths on each of the first and second opposite surfaces of the substrate, a front conductor path on the front surface and a rear conductor path on the rear surface;
a through-hole in the substrate having sidewalls declining from a top opening at the front surface to a bottom opening at the rear surface of the substrate;
an electrically isolating film covering a portion of the bottom opening and over adjacent portions of the sidewalls or the rear surface, the electrically isolating film having a free surface inside the through-hole facing the sidewalls of the through-hole;
a first aperture made in the electrically isolating film and located inside the bottom opening of the through-hole, the first aperture displaced from lower edges of the sidewalls;
the rear conductor path extending over the electrically isolating film to the first aperture;
a sidewall electrical conductor path electrically connected to the front conductor path and extending over one of the declining sidewalls to the first aperture;
an electrically conducting via in the first aperture, the via electrically interconnecting the sidewall conductor path and the rear conductor path; and
layers applied to the sidewalls, the layers including a layer of dielectric material and an electrically conductive layer, the electrically conductive layer connected to electrical signal ground when using the via structure, for impedance matching the sidewall conductor path.

2. The via structure of claim 1, wherein the cross-section area of the via is a small portion of the area of the rear surface.

3. The via structure of claim 1, comprising at least two distinct vias and at least two sidewall conductor paths connected to a respective via wherein the two sidewall conductor paths extend adjacent to each other and end at vias located along a line perpendicular to the conductor paths and two sidewall conductor paths extend along lines located in a plane perpendicular to the surfaces of the substrate and end at vias also located in this plane.

4. The via structure of claim 1, wherein the free surface of the electrically isolating film includes an electrically isolating support layer extending to the sidewalls for supporting and protecting the free surface, such that the free surface can carry at least two distinct vias.

5. The via structure of claim 1, comprising a via chip to be used in a three-dimensional multi-chip module for electrically interconnecting different levels of or different stacked substrates of the module.

6. The via structure of claim 1, comprising a substrate in a three-dimensional multi-chip module, the substrate carrying at least one electronic component.

7. The via structure of one of claim 1, wherein the sidewalls have an angle of approximately 54.74° in relation to a surface of the substrate.

8. The via structure of claim 1, wherein the substrate is made of monocrystalline silicon and in particular is a chip or plate.

9. The via structure of claim 1, wherein the sidewalls have an angle in the range of 45°–60° in relation to the surfaces of the substrate.

10. A via structure, comprising;
an electrically isolating or semiisolating substrate having first and second opposite surfaces, a front surface and a rear surface;
electrical conductor paths on each of the first and second opposite surfaces of the substrate, a front conductor path on the front surface and a rear conductor path on the rear surface;
a through-hole in the substrate having sidewalls declining from a top opening at the front surface to a bottom opening at the rear surface of the substrate;
an electrically isolating film extending over the bottom opening and over adjacent portions of the sidewalls or the rear surface, the electrically isolating film having a free surface inside the through-hole facing the sidewalls of the through-hole;
a first aperture made in the electrically isolating film and located inside the bottom opening of the through-hole, the first aperture displaced from lower edges of the sidewalls;
the rear conductor path extending over the electrically isolating film to the first aperture;
a sidewall electrical conductor path electrically connected to the front conductor path and extending over one of the declining sidewalls to the first aperture;
an electrically conducting via in the first aperture, the via electrically interconnecting the sidewall conductor path and the rear conductor path;
a first layer of dielectric material located on the sidewalls and underneath the sidewall conductor path;
a first electrically conductive layer located underneath the first layer of dielectric material and intended to be connected to electrical signal ground, when using the via structure; and
the dielectric material of and the thickness of the first layer being selected for making the sidewall conductor path impedance matched.

11. The via structure of claim 10, wherein the electrically isolating film extends over the rear surface and the via structure further comprises:
a second electrically conductive layer being located to extend over the rear surface and between the electrically isolating film and the rear surface of the substrate and intended to be connected to electrical signal ground, when using the via structure;
a second layer of dielectric material being located between the second electrically conductive layer and the rear surface of the substrate;
a second aperture being made in the second layer of dielectric material and located inside the through-hole; and
an electrically conducting via being applied in the second aperture interconnecting electrically the first and second electrically conductive layers.

12. A via structure comprising:
an electrically isolating or semiisolating substrate having first and second opposite surfaces, a front surface and a rear surface;
electrical conductor paths on each of the first and second opposite surfaces of the substrate, a front conductor path on the front surface and a rear conductor path on the rear surface;
a through-hole in the substrate having sidewalls declining from a top opening at the front surface to a bottom opening at the rear surface of the substrate;

an electrically isolating film extending over the bottom opening and over adjacent portions of the sidewalls or the rear surface, the electrically isolating film having a free surface inside the through-hole facing the sidewalls of the through-hole;

a first aperture made in the electrically isolating film and located inside the bottom opening of the through-hole;

the rear conductor path extending over the electrically isolating film to the first aperture;

a sidewall electrical conductor path electrically connected to the front conductor path and extending over one of the declining sidewalls to the first aperture;

an electrically conducting via in the first aperture, the via electrically interconnecting the sidewall conductor path and the rear conductor path;

a first layer of dielectric material located on the sidewalls and underneath the sidewall conductor path; and a first electrically conductive layer located underneath the first layer of dielectric material and intended to be connected to electrical signal ground, when using the via structure; and the dielectric material of and the thickness of the first layer being selected for making the sidewall conductor path impedance matched.

13. The via structure of claim 12, wherein the electrically isolating film extends over the rear surface and the via structure further comprises:

a second electrically conductive layer extending over the rear surface and between the electrically isolating film and the rear surface of the substrate and intended to be connected to electrical signal ground, when using the via structure;

a second layer of dielectric material located between the second electrically conductive layer and the rear surface of the substrate;

a second aperture in the second layer of dielectric material and located inside the through-hole; and an electrically conducting via applied in the second aperture interconnecting electrically the first and second electrically conductive layers.

* * * * *